(12) United States Patent
Ju

(10) Patent No.: US 10,103,470 B2
(45) Date of Patent: Oct. 16, 2018

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD., Keelung (TW)

( * ) Notice: Subject to any disclaimer, the term of this patent is extended or adjusted under 35 U.S.C. 154(b) by 0 days.

(21) Appl. No.: 15/692,308

(22) Filed: Aug. 31, 2017

(65) Prior Publication Data

US 2018/0205168 A1    Jul. 19, 2018

(30) Foreign Application Priority Data

Jan. 18, 2017 (CN) ..................... 2017 2 0053916 U

(51) Int. Cl.
| | |
|---|---|
| H01R 12/00 | (2006.01) |
| H01R 13/24 | (2006.01) |
| H01R 12/71 | (2011.01) |
| H01R 13/41 | (2006.01) |
| G01R 1/067 | (2006.01) |
| H01R 43/16 | (2006.01) |
| H01R 43/02 | (2006.01) |

(52) U.S. Cl.
CPC ..... H01R 13/2435 (2013.01); G01R 1/06716 (2013.01); H01R 12/714 (2013.01); H01R 13/2492 (2013.01); H01R 13/41 (2013.01); H01R 43/0249 (2013.01); H01R 43/0256 (2013.01); H01R 43/16 (2013.01)

(58) Field of Classification Search
CPC ............ H01R 13/2435; H01R 13/2492; H01R 13/41; H01R 12/714; H01R 43/0249; H01R 43/0256; H01R 43/16; G01R 1/06716

USPC .......................................... 439/66
See application file for complete search history.

(56) References Cited

U.S. PATENT DOCUMENTS

| | | | | |
|---|---|---|---|---|
| 5,306,163 A | * | 4/1994 | Asakawa ............. | H01R 12/716 439/607.01 |
| 5,324,205 A | * | 6/1994 | Ahmad ................ | H01R 12/714 439/66 |

(Continued)

FOREIGN PATENT DOCUMENTS

| CN | 2587076 Y | 11/2003 |
|---|---|---|
| CN | 1499673 A | 5/2004 |

(Continued)

*Primary Examiner* — Abdullah Riyami
*Assistant Examiner* — Vladimir Imas
(74) *Attorney, Agent, or Firm* — Locke Lord LLP; Tim Tingkang Xia, Esq.

(57) ABSTRACT

An electrical connector includes an insulating body having multiple receiving slots, and multiple first terminals and multiple second terminals respectively received in the receiving slots. Each first terminal has a first connecting portion, a first elastic arm bending and upward extending from the first connecting portion, and a first conducting arm bending and extending from the first connecting portion. Each second terminal has a second connecting portion, a second elastic arm bending and extending upward from the second connecting portion, and a second conducting arm bending and extending from the second connecting portion. A bent position between each of the first connecting portions and a corresponding one of the first elastic arms is higher than a bent position between each of the second connecting portions and a corresponding one of the second elastic arms.

13 Claims, 10 Drawing Sheets

(56) References Cited

U.S. PATENT DOCUMENTS

| | | | | |
|---|---|---|---|---|
| 5,655,913 | A * | 8/1997 | Castaneda | H01R 12/57 439/66 |
| 5,938,451 | A * | 8/1999 | Rathburn | H01R 13/2414 439/66 |
| 6,027,345 | A * | 2/2000 | McHugh | H01R 9/28 439/66 |
| 6,135,783 | A * | 10/2000 | Rathburn | H01R 13/2414 439/592 |
| 6,206,707 | B1 * | 3/2001 | Huang | H01R 13/6585 439/74 |
| 6,247,938 | B1 * | 6/2001 | Rathburn | H01R 13/2414 439/66 |
| 6,409,521 | B1 * | 6/2002 | Rathburn | H01R 13/2435 439/66 |
| 6,474,996 | B2 * | 11/2002 | Watanabe | H01R 12/774 439/66 |
| 6,604,950 | B2 * | 8/2003 | Maldonado | H05K 7/1069 439/591 |
| 6,758,702 | B2 * | 7/2004 | Johnescu | H01R 13/2442 439/66 |
| 6,793,504 | B2 * | 9/2004 | Noda | H05K 7/1069 439/591 |
| 6,872,082 | B2 * | 3/2005 | Hsu | H01R 9/096 439/591 |
| 7,083,424 | B2 * | 8/2006 | Motohashi | H01R 13/2435 439/66 |
| 7,156,706 | B2 * | 1/2007 | Brown | H01R 13/2492 439/66 |
| 7,160,115 | B2 * | 1/2007 | Huang | H01R 13/2435 439/66 |
| 7,214,069 | B2 * | 5/2007 | Rathburn | H01R 13/2435 439/66 |
| 7,585,174 | B2 * | 9/2009 | Ju | H01R 13/2414 439/66 |
| 7,791,443 | B1 * | 9/2010 | Ju | H01R 12/52 336/107 |
| 7,794,237 | B1 * | 9/2010 | Terhune, IV | H01R 13/2407 439/66 |
| 7,891,983 | B2 * | 2/2011 | Ichimura | H01R 13/2428 439/66 |
| 8,202,101 | B2 * | 6/2012 | Zimmerman | H01R 4/02 439/70 |
| 8,439,709 | B2 * | 5/2013 | Fan | H01R 12/716 439/660 |
| 8,491,337 | B2 * | 7/2013 | Cai | H01R 12/57 439/607.28 |
| 8,708,711 | B2 * | 4/2014 | Horikawa | H01R 12/52 439/66 |
| 8,821,188 | B2 * | 9/2014 | Chang | H01R 13/648 439/607.01 |
| 8,888,502 | B2 * | 11/2014 | Terhune, IV | H01R 13/2407 439/66 |
| 8,932,080 | B2 * | 1/2015 | Chang | H05K 7/1069 439/607.1 |
| 9,172,161 | B2 * | 10/2015 | Walden | H01R 12/714 439/66 |
| 9,178,322 | B2 * | 11/2015 | Chang | H01R 13/6594 |
| 9,225,121 | B2 * | 12/2015 | Chang | H01R 13/6585 |
| 9,257,790 | B2 * | 2/2016 | Chang | H01R 13/6585 |
| 2003/0124879 | A1 * | 7/2003 | Ng | H01R 12/714 439/66 |
| 2009/0075497 | A1 * | 3/2009 | Swart | H01R 12/714 439/66 |

FOREIGN PATENT DOCUMENTS

| | | |
|---|---|---|
| CN | 1610991 A | 4/2005 |
| CN | 2727996 Y | 9/2005 |
| CN | 2779652 Y | 5/2006 |
| CN | 1825710 A | 8/2006 |
| CN | 1901288 A | 1/2007 |
| CN | 201440492 U | 4/2010 |
| CN | 201868603 U | 6/2011 |
| CN | 102208720 A | 10/2011 |
| CN | 202196955 U | 4/2012 |
| CN | 104218391 A | 12/2014 |

* cited by examiner

ELECTRICAL CONNECTOR

CROSS-REFERENCE TO RELATED APPLICATION

This non-provisional application claims priority to and benefit of, under 35 U.S.C. § 119(a), Patent Application No. 201720053916.2 filed in P.R. China on Jan. 18, 2017, the entire content of which is hereby incorporated by reference.

FIELD OF THE INVENTION

The present invention relates to an electrical connector, and more particularly to a land grid array electrical connector that is used for electrically connecting a chip module to a circuit board.

BACKGROUND OF THE INVENTION

Due to stable electrical properties, electrical connectors have been widely applied to electronic fields, such as computers. An electrical connector for electrically connecting a chip module to a circuit board commonly includes an insulating body and conductive terminals received in the insulating body. The conductive terminals are used for transmitting signals between the chip module and the circuit board. However, the arrangement density of the conductive terminals is increased continuously along with the increasing of information transmission quantity, so that crosstalk between the conductive terminals is increasingly serious to influence the signal transmission quality.

There are two crosstalk inhibition manners which are conventionally known in the art. The first crosstalk inhibition manner: a crosstalk inhibition structure is arranged at the periphery of the insulating body, such as an electrical connector disclosed in a Chinese Patent No CN201120275304, which includes an insulating body provided with receiving slots, conductive terminals received in the receiving slots and a metal frame arranged at the periphery of the receiving slots and insert-molded in the insulating body. The metal frame has a shielding effect on the conductive terminals. The second crosstalk inhibition manner: a crosstalk inhibition structure is arranged in the insulating body, such as an electrical connector disclosed in a Chinese Patent No. CN201310212176, which includes an insulating body and a terminal assembly received in the insulating body. The terminal assembly includes multiple conductive terminals arrayed in rows, a metal sheet provided with multiple through holes for the conductive terminals to pass through, and an insulating member for fixing the conductive terminals and the metal sheet. Each conductive terminal has a retaining portion retained in the insulating member, a first elastic arm arranged in a manner of extending upward from the retaining portion and a second elastic arm arranged in a manner of extending downward from the retaining portion. The first elastic arms and the second elastic arms are symmetrically arranged relative to the metal sheet, thereby alleviating signal crosstalk between the conductive terminals.

However, the two electrical connectors at least have the following disadvantages: in order to alleviate the crosstalk problem between the terminals, the metal frame is arranged at the periphery of the insulating body or the metal sheet is arranged in the insulating body, so that parts of the electrical connector are increased, and the molding difficulty and the production cost of the electrical connector are increased.

Therefore, a heretofore unaddressed need exists in the art to address the aforementioned deficiencies and inadequacies.

SUMMARY OF THE INVENTION

In one aspect, the present invention relates to an electrical connector that has at least two types of terminals with different structures arranged in receiving slots of an insulating body, so as to alleviate the crosstalk problem between the terminals.

In certain embodiments an electrical connector includes an insulating body for sustaining a chip module and multiple first terminals and multiple second terminals. Multiple rows of receiving slots which have equal row spacing and run through the insulating body are formed in the insulating body. The first and second terminals are correspondingly received in the receiving slots. Each first terminal has a first connecting portion, a first elastic arm bending and extending upward from the first connecting portion, a first contact portion formed from the top of the first elastic arm for urging upward the chip module, and a first conducting arm formed by bending and extending from the first connecting portion and used for downward conductively connecting the circuit board. Each second terminal has a second connecting portion, a second elastic arm bending and extending upward from the second connecting portion, a second contact portion formed from the top of the second elastic arm and used for urging upward the chip module, and a second conducting arm formed by bending and extending from the second connecting portion and used for conductively connecting the circuit board, a bent position between each of the first connecting portions and a corresponding one of the first elastic arms is higher than a bent position between each of the second connecting portions and a corresponding one of the second elastic arms, heights of the first contact portions are the same as those of the second contact portions, and the heights of lowest points of the first conducting arms are equal to those of lowest points of the second conducting arms.

In certain embodiments, a bent position between each of the first connecting portions and a corresponding one of the first conducting arms is higher than a bent position between each of the second connecting portions and corresponding one of the second conducting arms.

In certain embodiments, in a horizontal direction, the first connecting portions are not overlapped with the second connecting portions; the first elastic arms are not overlapped with the second elastic arms; and the first conducting arms are not overlapped with the second conducting arms.

In certain embodiments, structures of the first terminals are the same as structures, overturned up and down for 180 degrees, of the second terminals.

In certain embodiments, the first terminals and the second terminals are arranged in rows and arranged alternately and each two adjacent rows of receiving slots are formed oppositely; and directions of the first contact portions are consistent to directions of the second contact portions and directions of the conducting arms are consistent to directions of the second conducting arms.

In certain embodiments, one row of other terminals are further arranged between each row of first terminals and each row of second terminals, the other terminals are staggered with the first terminals and the second terminals, and the structures of the other terminals are different from those of the first terminals and the second terminals.

In certain embodiments, the first terminals and the second terminals are arranged in rows and arranged alternately and each two adjacent rows of receiving slots are formed in a staggered manner; and directions of the first contact portions are consistent to directions of the second contact portions and directions of the conducting arms are consistent to directions of the second conducting arms.

In certain embodiments, the first terminals and the second terminals are arrayed in a matrix shape and the first terminals and the second terminals are alternately arranged in each row and each column of receiving slots.

In certain embodiments, the first connecting portions are arc-shaped, the first elastic arms are formed by obliquely and upward extending along a straight line from the first connecting portions, the arc-shaped first contact portions are formed by bending and extending from the first elastic arms, the first conducting arms are formed by obliquely and downward extending along a straight line from the first connecting portions, arc-shaped first conducting portions, used for butting the circuit board, are formed at tail ends of the first conducting arms, and the first elastic arms and the first conducting arms are located at the same side of the first connecting portions; the second connecting portions are arc-shaped, the second elastic arms are formed by obliquely and upward extending along a straight line from the second connecting portions, the arc-shaped second contact portions are formed by bending and extending from the first elastic arms, the second conducting arms are formed by obliquely and downward extend along a straight line from the second connecting portions, arc-shaped second conducting portions, used for butting the circuit board, are formed at the tail ends of the second conducting arms, and the second elastic arms and the second conducting arms are located at the same side of the second connecting portions; and a bent position between each of the first connecting portions and corresponding one of the first conducting arms is higher than a bent position between each of the second connecting portions and a corresponding one of the second elastic arms.

In another aspect, the present invention relates to an electrical connector. In certain embodiments, an electrical connector for electrically connecting a chip module and a circuit board includes an insulating body for sustaining the chip module and multiple first terminals and multiple second terminals. The insulating body is provided with multiple receiving slots arrayed in a matrix shape and running through the insulating body. The first and second terminals are arrayed in the matrix shape and correspondingly received in the receiving slots. Each first terminal has a first contact portion for being in contact with the chip module, and a first conducting portion for conductively connecting the circuit board. Each second terminal has a second contact portion for being in contact with the chip module, and a second conducting portion for conductively connecting the circuit board. Structures of the first terminals are different from those of the second terminals, and the structures of the first terminals are the same as the structures, which are overturned up and down for 180 degrees, of the second terminals.

In certain embodiments, except that the heights of the first contact portions are consistent to the heights of the second contact portions and the heights of the first conducting portions are consistent to the heights of the second conducting portions, other portions of the first terminals are not overlapped with corresponding other portions of the second terminals in a horizontal direction.

In certain embodiments, the first terminal comprises an arc-shaped first connecting portion, a first elastic arm is formed by obliquely and upward extending along a straight line from the first connecting portion, an arc-shaped first contact portion is formed by bending and extending from the first elastic arm, a first conducting arm is formed by obliquely and downward extending along a straight line from the first connecting portion, the first conducting portion that is arc-shaped, used for butting the circuit board, is formed at a tail end of the first conducting arm, wherein each of the second terminals comprises a second connecting portion that is arc-shaped, a second elastic arm formed by obliquely and upward extending along a straight line from the second connecting portion, the second contact portion that is arc-shaped and is formed by bending and extending from the second elastic arm, a second conducting arm formed by obliquely and downward extending along a straight line from the second connecting portion, the second conducting portion that is arc-shaped, is used for urging the circuit board, and is formed at a tail end of the second conducting arm; and wherein a bent position between each of the first connecting portions and a corresponding one of the first conducting arms is higher than a bent position between each of the second connecting portions and a corresponding one of the second elastic arms.

In certain embodiments, the first contact portions and the first conducting portions are arranged oppositely along an up and down direction.

Compared with the related art, the present invention has the following beneficial effects:

The directly facing area between the adjacent terminals is reduced by setting at least two types of terminals with different structures, thereby alleviating a crosstalk problem of signal transmission between the terminals; and the metal frame body or the metal sheet does not need to be additionally arranged at the periphery of the insulating body or in the insulating body, so that parts of the electrical connector are reduced, the molding difficulty is reduced and the production cost of the electrical connector is reduced.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
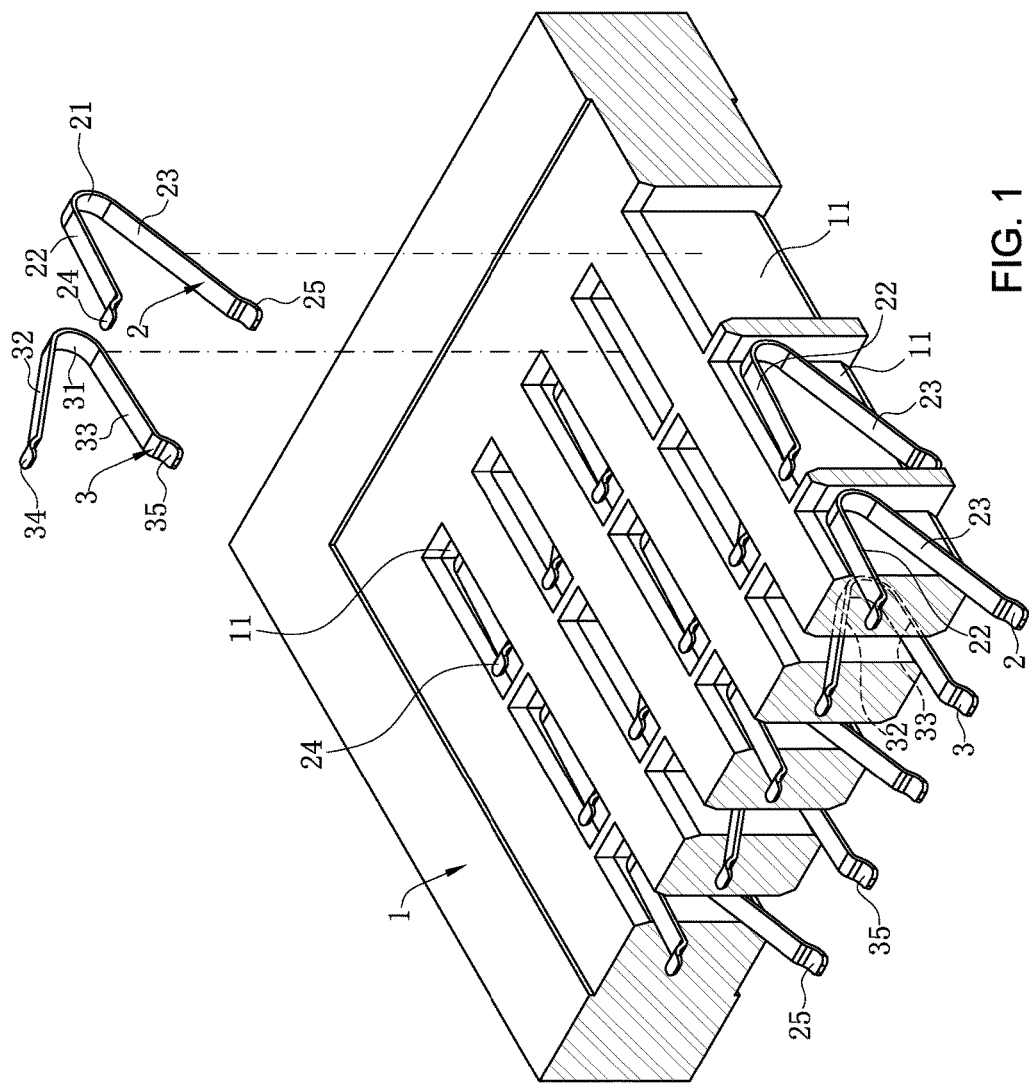
FIG. 1 is a schematic three-dimensional sectional view of an electrical connector according to one embodiment of the present invention.
Figure 2:
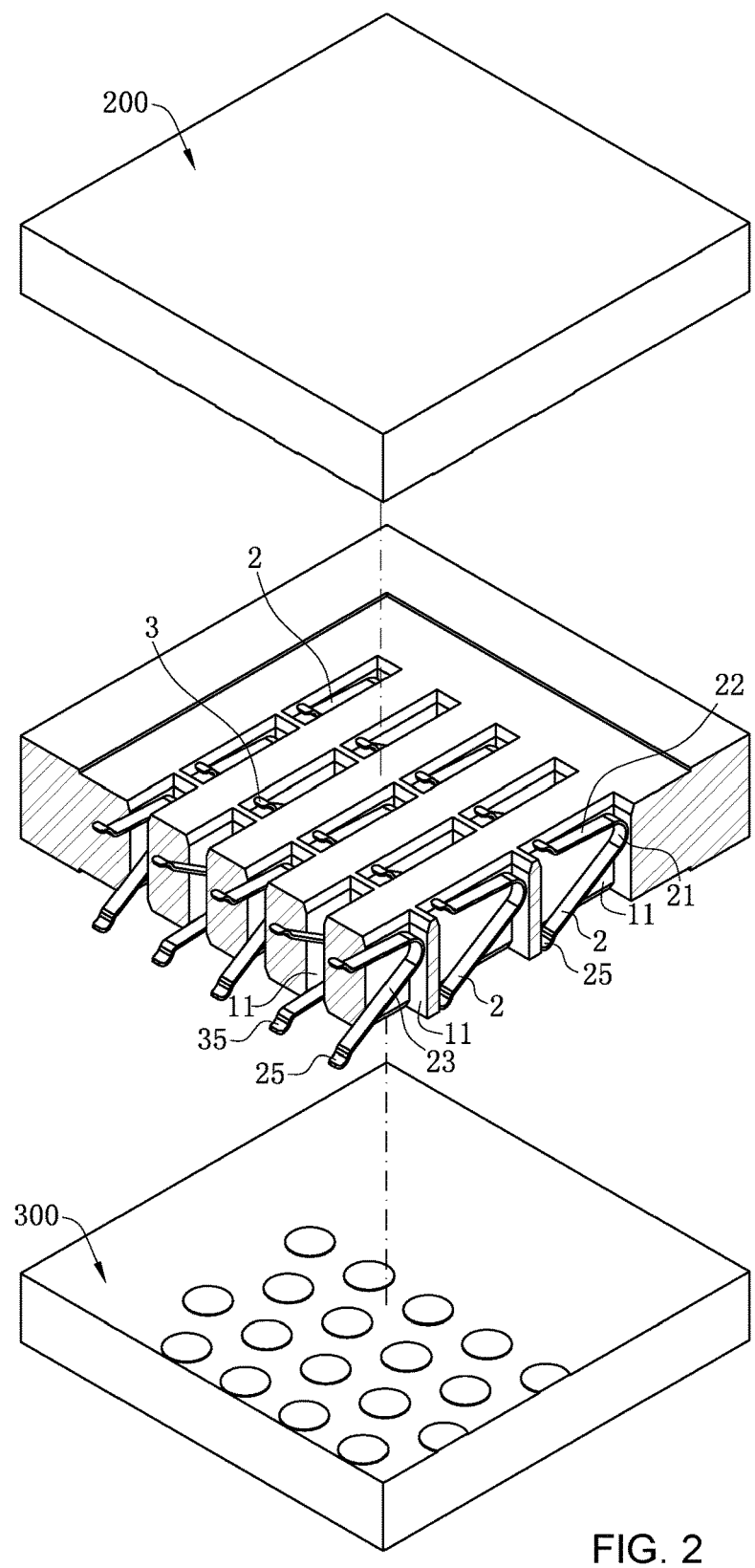
FIG. 2 is a schematic three-dimensional sectional view of an electrical connector according to one embodiment of the present invention, where the electrical connector is located between a chip module and a circuit board and the chip module is not pressed down.
Figure 3:
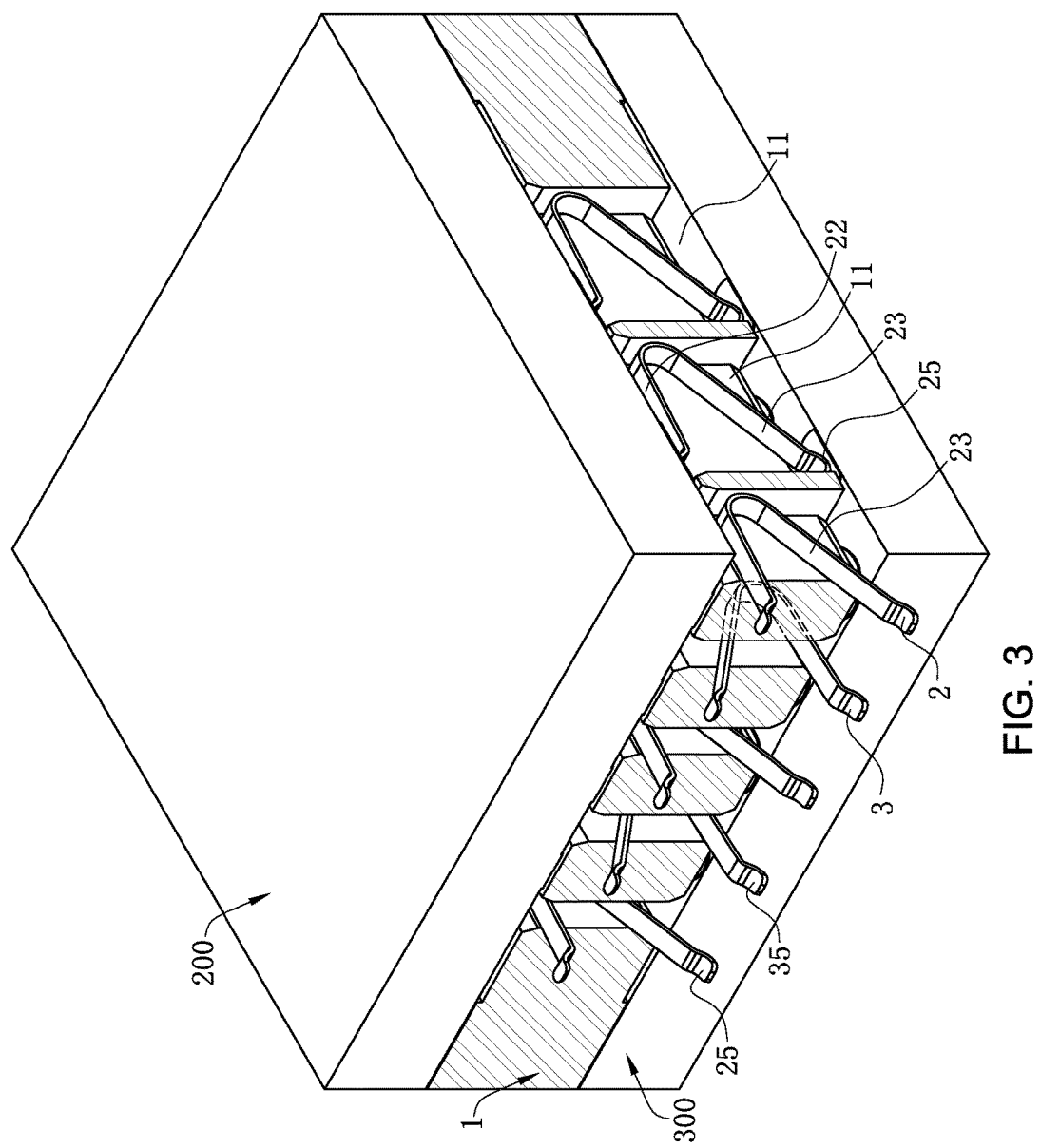
FIG. 3 is a schematic three-dimensional sectional view of an electrical connector according to one embodiment of the present invention, where the electrical connector is located between the chip module and the circuit board and the chip module is pressed down.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-10. In accordance with the purposes of this invention, as embodied and broadly described herein, this invention, in one aspect, relates to an electrical connector.

As shown in FIGS. 1-7, an electrical connector 100 according to a first embodiment of the present invention includes an insulating body 1 and multiple first terminals 2 and multiple second terminals 3. The insulating body 1 has multiple receiving slots 11 arranged in a matrix and have the equal row spacing, and the receiving slots 11 run through the insulating body 1 up and down. Each two adjacent rows of receiving slots 11 are arranged oppositely. The first terminals 2 and the second terminals 3 are respectively received in the receiving slots 11. The first terminals 2 and the second terminals 3 are arranged in rows and arranged alternately.

Figure 4:
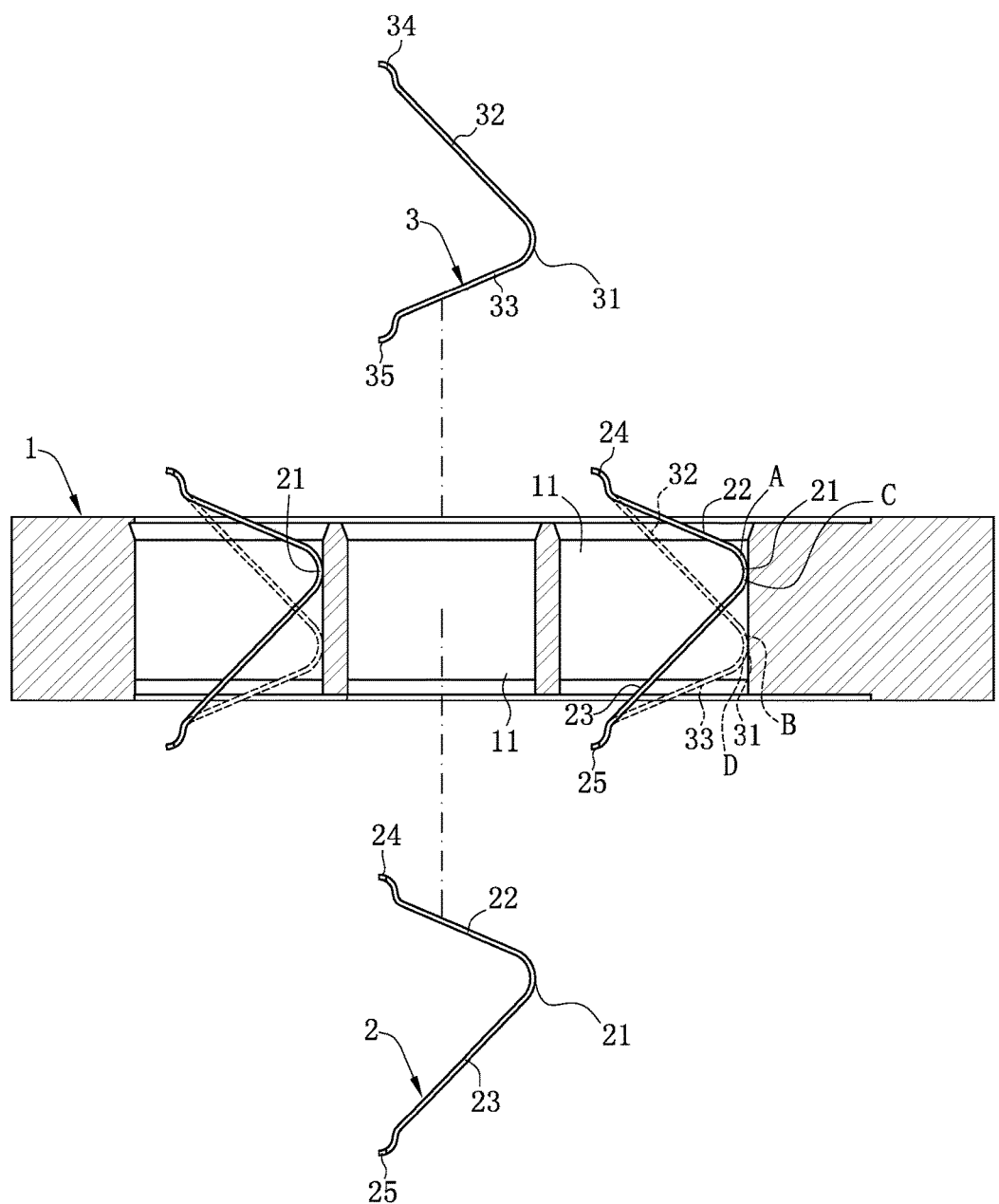
FIG. 4 is a plane sectional view of an electrical connector according to one embodiment of the present invention.

As shown in FIGS. 1 and 4, the first terminal 2 is provided with an arc-shaped first connecting portion 21, a first elastic arm 22 is formed by upward and obliquely bending and extending from the first connecting portion 21 along a straight line, an arc-shaped first contact portion 24 for upward urging a chip module 200 is formed by bending from the top of the first elastic arm 22 (in other embodiments, the first contact portion 24 can also be not arc-shaped), a first conducting arm 23 is formed by downward and obliquely bending and extending from the first connecting portion 21 along a straight line, an arc-shaped first conducting portion 25 for downward urging the circuit board 300 is formed at a tail end of the first conducting arm 23 (in other embodiments, the first conducting portion 25 can also be not arc-shaped and is soldered on the circuit board 300 through a solder ball), and the first elastic arm 22 and the first conducting arm 23 are disposed at the same side of the first connecting portion 21 (in other embodiments, the first elastic arm 22 and the first conducting arm 23 can also be located at two opposite sides of the first connecting portion 21). The second terminal 3 is provided with an arc-shaped second connecting portion 31, a second elastic arm 32 is formed by obliquely and upward bending and extending from the second connecting portion 31 along a straight line, an arc-shaped second contact portion 34 for upward urging the chip module 200 is formed by bending from the top of the second elastic arm 32, a second conducting arm 33 is formed by obliquely and downward bending and extending from the second connecting portion 31 along a straight line, an arc-shaped second conducting portion 35, used for downward urging the circuit board 300, is formed at a tail end of the second conducting arm 33, and the second elastic arm 32 and the second conducting arm 33 are disposed at the same side of the second connecting portion 31.

Figure 5:
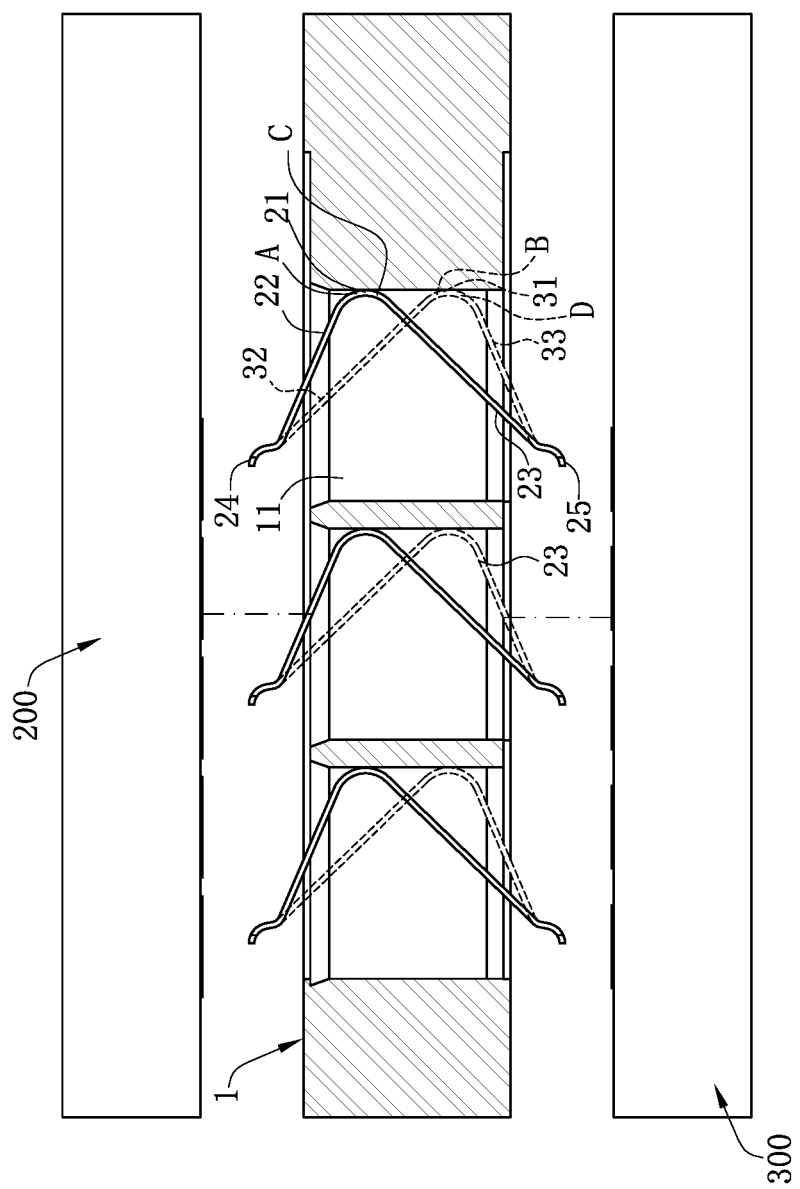
FIG. 5 is a plane sectional view of an electrical connector according to one embodiment of the present invention, where the electrical connector is located between the chip module and the circuit board and the chip module is not pressed down.
Figure 6:
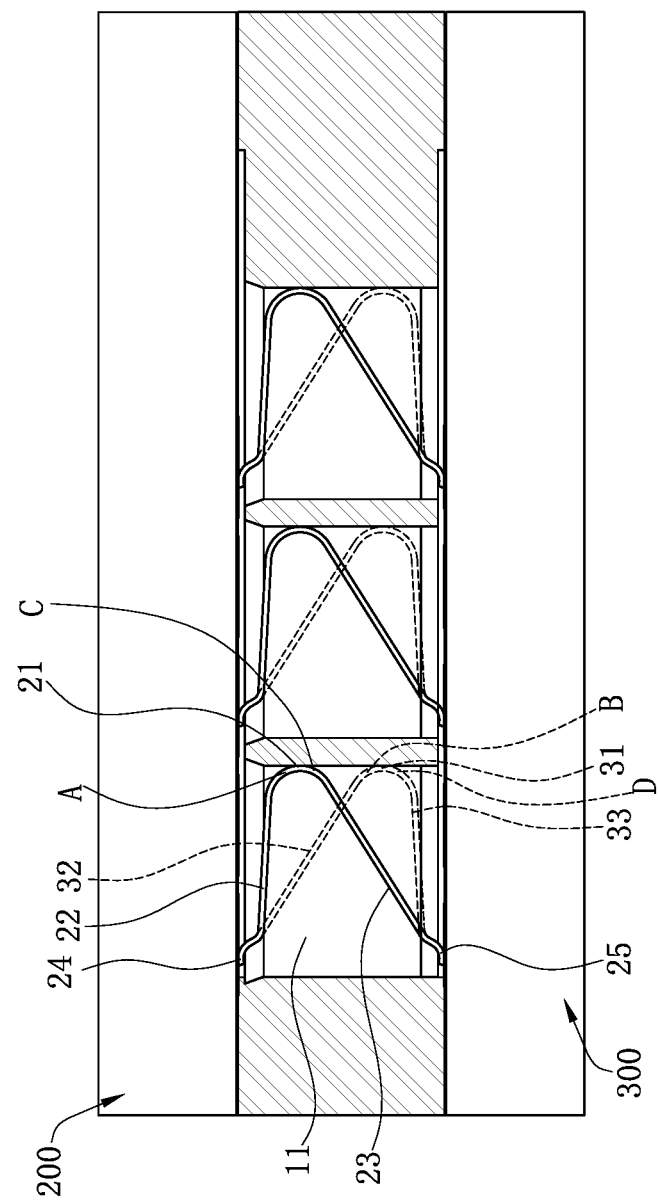
FIG. 6 is a plane sectional view of an electrical connector according to one embodiment of the present invention, where the electrical connector is located between the chip module and the circuit board and the chip module is pressed down.
Figure 7:
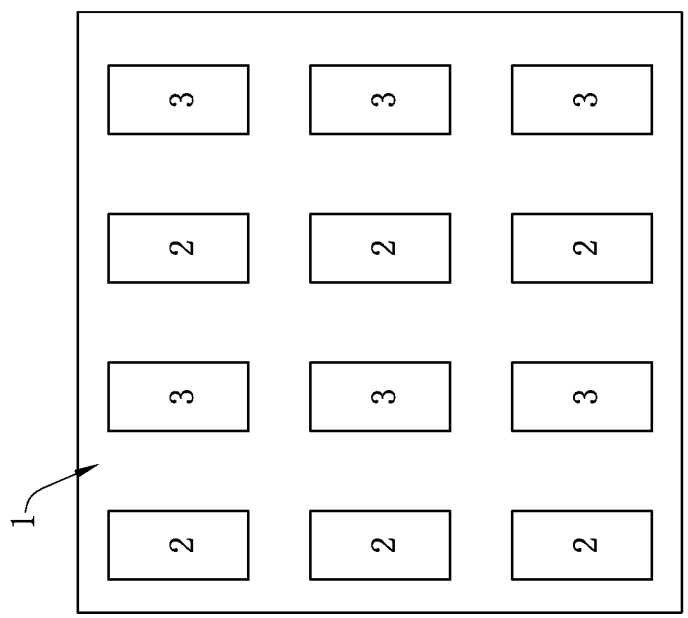
FIG. 7 is a schematic diagram of an electrical connector according to a first embodiment of the present invention.

As shown in FIGS. 4-6, a bent position A between the first connecting portions 21 and the first elastic arms 22 is higher than a bent position B between the second connecting portions 31 and the second elastic arms 32, a bent position C between the first connecting portions 21 and the first conducting arms 23 is higher than a bent position D between the second connecting portions 31 and the second conducting arms 33, and the bent position C between the first connecting portions 21 and the first conducting arms 23 is higher than the bent position B between the second connecting portions 31 and the second elastic arms 32. Directions of the first contact portions 24 are consistent to directions of the second contact portions 34 and directions of the first conducting arms 23 are consistent to directions of the second conducting arms 33; the heights of the first contact portions 24 are equal to the heights of the second contact portions 34, the heights of lowest points of the first conducting arms 23 are equal to the heights of the lowest points of the second conducting arms 33, in a horizontal direction, the first connecting portions 21 are not overlapped with the second connecting portions 31, the first elastic arms 22 are not overlapped with the second elastic arms 32, the first conducting arms 23 are not overlapped with of the second conducting arms 33, the first contact portions 24 and the first conducting portions 25 are arranged oppositely along the up and down direction, and structures of the first terminals 2 are the same as structures, which are overturned up and down for 180 degrees, of the second terminals 3.

Figure 8:
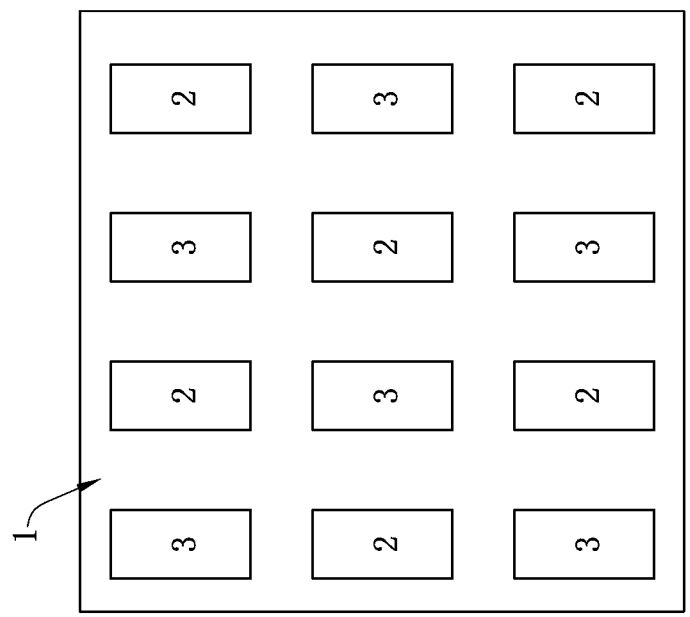
FIG. 8 is a schematic diagram of an electrical connector according to a second embodiment of the present invention.

FIG. 8 shows an electrical connector 100 according to a second embodiment of the present invention. The difference between the second embodiment and the first embodiment is that: the first terminals 2 and the second terminals 3 are arranged in each row of receiving slots 11 in a staggered manner.

Figure 9:
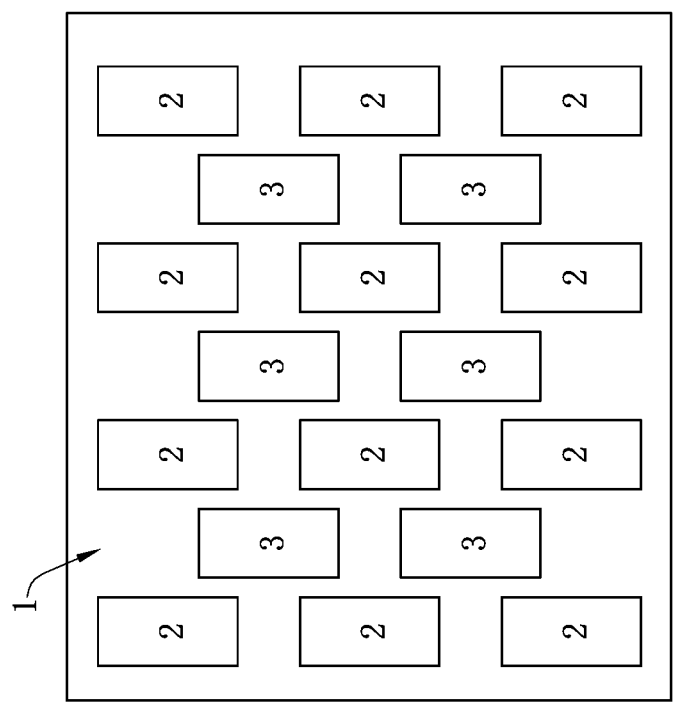
FIG. 9 is a schematic diagram of an electrical connector according to a third embodiment of the present invention.

FIG. 9 shows an electrical connector 100 according to a third embodiment of the present invention. The difference between the third embodiment and the first embodiment is that: two adjacent rows of receiving slots 11 are arranged in a staggered manner.

Figure 10:
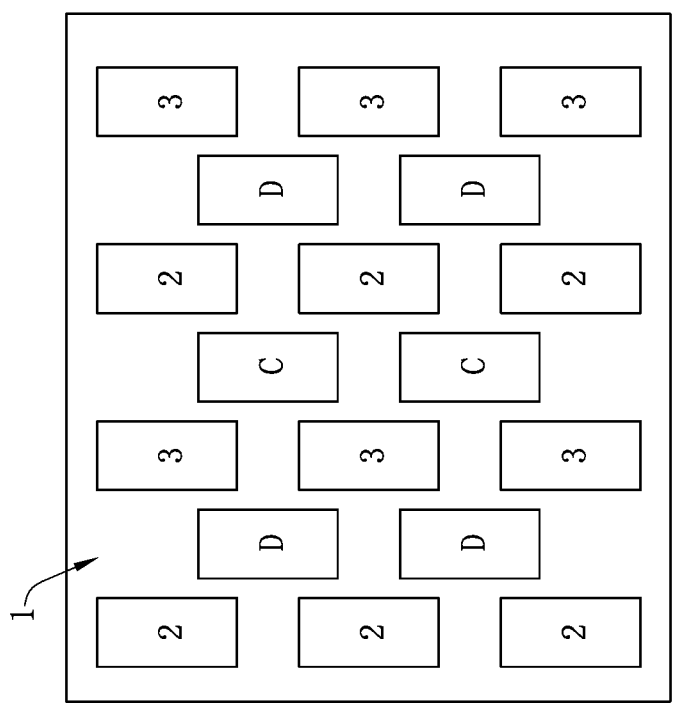
FIG. 10 is a schematic diagram of an electrical connector according to a fourth embodiment of the present invention.

FIG. 10 shows an electrical connector 100 according to a fourth embodiment of the present invention. The difference between the fourth embodiment and the third embodiment is that: one row of other terminals are further arranged between each row of first terminals 2 and each row of second terminals 3, the other terminals are staggered with the first terminals 2 and the second terminals 3, and the structures of the other terminals are different from those of the first terminals 2 and the second terminals 3; multiple other terminals can be terminals C with the same structure, and can also be terminals C and D with different structures.

In summary, the electrical connector 100 according to certain embodiments of the present invention, among other things, has the following beneficial advantages:

(1) At least two types of terminals with different structures are arranged in the receiving slots 11 of the insulating body 1; except that the heights of the first contact portions 24 are the same as those of the second contact portions 34 and the heights of the first conducting portions 25 are the same as those of the second conducting portions 35, other portions of the first terminals 2 are not overlapped with corresponding other portions of the second terminals 3 in a horizontal direction, and the directly facing area between the adjacent terminals is greatly reduced, thereby alleviating a crosstalk problem of signal transmission between the terminals; there is no need of additionally arranging a metal frame body or a metal sheet at the periphery of the insulating body 1 or in the insulating body 1, so that parts of the electrical connector 100 are reduced, the molding difficulty is reduced and the production cost of the electrical connector 100 is reduced.

(2) The structures of the first terminals 2 are the same as structures, which are overturned up and down for 180 degrees, of the second terminals 3, so that only one set of mold is needed for producing the first terminals 2 and the second terminals 3, and the extra cost caused by multiple sets of molds is reduced.

(3) The receiving slots 11 of the adjacent rows are arranged in the staggered manner, thereby reducing the directly facing area between the adjacent terminals and improving the crosstalk problem of signal transmission between the terminals.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module and a circuit board, comprising:
    an insulating body for sustaining the chip module, comprising a plurality of rows of receiving slots running through the insulating body, the plurality of rows of receiving slots having equal row spacing; and
    a plurality of first terminals and a plurality of second terminals, respectively received in the receiving slots,
    wherein each of the first terminals comprises a first connecting portion, a first elastic arm bending and extending upward from one side of the first connecting portion, a first contact portion formed from a top of the first elastic arm and used for urging upward the chip module, and a first conducting arm bending and extending downward from the first connecting portion for conducting downward the circuit board;
    wherein each of the second terminals comprises a second connecting portion, a second elastic arm bending and extending upward from one side of the second connecting portion, a second contact portion formed from a top of the second elastic arm and used for urging upward the chip module, and a second conducting arm bending and extending downward from the second connecting portion for conducting downward the circuit board;
    wherein a bent position between each of the first connecting portions and a corresponding one of the first elastic arms and a bent position between each of the second connecting portions and a corresponding one of the second elastic arms are located on a same side, and the bent position between each of the first connecting portions and the corresponding one of the first elastic arms is higher than the bent position between each of the second connecting portions and the corresponding one of the second elastic arms; and
    wherein heights of the first contact portions are the same as heights of the second contact portions, and heights of lowest points of the first conducting arms are equal to heights of lowest points of the second conducting arms.

2. The electrical connector according to claim 1, wherein a bent position between each of the first connecting portions and a corresponding one of the first conducting arms is higher than a bent position between each of the second connecting portions and a corresponding one of the second conducting arms.

3. The electrical connector according to claim 1, wherein in a horizontal direction, the first connecting portions are not overlapped with the second connecting portions, the first elastic arms are not overlapped with the second elastic arms, and the first conducting arms are not overlapped with the second conducting arms.

4. The electrical connector according to claim 1, wherein structures of the first terminals are the same as structures, which are overturned up and down for 180 degrees, of the second terminals.

5. The electrical connector according to claim 1, wherein the first terminals and the second terminals are respectively arranged in rows and arranged alternately, each two adjacent rows of the receiving slots are formed oppositely, directions of the first contact portions are consistent to directions of the second contact portions, and directions of the first conducting arms are consistent to directions of the second conducting arms.

6. The electrical connector according to claim 5, wherein a row of other terminals are further arranged between each adjacent a row of first terminals and a row of second terminals, the other terminals are staggered with the first terminals and the second terminals, and structures of the other terminals are different from structures of the first terminals and the second terminals.

7. The electrical connector according to claim 1, wherein the first terminals and the second terminals are respectively arranged in rows and arranged alternately, each two adjacent rows of the receiving slots are formed in a staggered manner, directions of the first contact portions are consistent to directions of the second contact portions, and directions of the conducting arms are consistent to directions of the second conducting arms.

8. The electrical connector according to claim 1, wherein the first terminals and the second terminals are arrayed in a matrix, and the first terminals and the second terminals are alternately arranged in each row and each column of the receiving slots.

9. The electrical connector according to claim 1,
wherein for each of the first terminals, the first connecting portion is arc-shaped, the first elastic arm is formed by obliquely and upward extending along a straight line from the first connecting portion, the first contact portion is arc-shaped and is formed by bending and extending from the first elastic arm, the first conducting arm is formed by obliquely and downward extending along a straight line from the first connecting portion, a first conducting portion is arc-shaped, is used for urging the circuit board, and is formed at a tail end of the first conducting arm, and the first elastic arm and the first conducting arm are located at a same side of the first connecting portion;
wherein for each of the second terminals, the second connecting portion is arc-shaped, the second elastic arm is formed by obliquely and upward extending along a straight line from the second connecting portions, the second contact portion is arc-shaped and is formed by bending and extending from the second elastic arm, the second conducting arm is formed by obliquely and downward extending along a straight line from the second connecting portion, a second conducting portion is arc-shaped, is used for urging the circuit board, and is formed at a tail end of the second conducting arm, and the second elastic arm and the second conducting arm are located a same side of the second connecting portion; and
wherein a bent position between each of the first connecting portions and corresponding one of the first conducting arms is higher than a bent position between each of the second connecting portions and a corresponding one of the second elastic arms.

10. An electrical connector for electrically connecting a chip module and a circuit board, comprising:
an insulating body for sustaining the chip module, comprising a plurality of receiving slots running through the insulating body and arranged in a matrix; and
a plurality of first terminals and a plurality of second terminals respectively received in the receiving slots,
wherein each of the first terminals comprises a first contact portion for contacting the chip module and a first conducting portion for conducting the circuit board;
wherein each of the second terminals comprises a second contact portion for contacting the chip module and a second conducting portion for conducting the circuit board; and
wherein structures of the first terminals are the same as structures, which are overturned up and down for 180 degrees, of the second terminals.

11. The electrical connector according to claim 10, wherein except that heights of the first contact portions are consistent to heights of the second contact portions and heights of the first conducting portions are consistent to heights of the second conducting portions, other portions of the first terminals are not overlapped with corresponding other portions of the second terminals in a horizontal direction.

12. The electrical connector according to claim 10,
wherein each of the first terminals comprises a first connecting portion that is arc-shaped, a first elastic arm formed by obliquely and upward extending along a straight line from the first connecting portion, the first contact portion that is arc-shaped and is formed by bending and extending from the first elastic arm, a first conducting arm formed by obliquely and downward extending along a straight line from the first connecting portion, the first conducting portion that is arc-shaped, is used for urging the circuit board, and is formed at a tail end of the first conducting arm;
wherein each of the second terminals comprises a second connecting portion that is arc-shaped, a second elastic arm formed by obliquely and upward extending along a straight line from the second connecting portion, the second contact portion that is arc-shaped and is formed by bending and extending from the second elastic arm, a second conducting arm formed by obliquely and downward extending along a straight line from the second connecting portion, the second conducting portion that is arc-shaped, is used for urging the circuit board, and is formed at a tail end of the second conducting arm; and
wherein a bent position between each of the first connecting portions and a corresponding one of the first conducting arms is higher than bent position between each of the second connecting portions and a corresponding one of the second elastic arms.

13. The electrical connector according to claim 12, wherein each of the first contact portions and corresponding one of the first conducting portions are arranged oppositely along an up and down direction.

* * * * *